United States Patent
Wang (10) Patent No.: US 9,806,085 B1
(45) Date of Patent: Oct. 31, 2017

(54) SEMICONDUCTOR DEVICE AND METHOD OF FORMING THE SAME (71) Applicant: UNITED MICROELECTRONICS CORP., Hsin-Chu (TW)

(72) Inventor: Sanpo Wang, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/221,618

(22) Filed: Jul. 28, 2016

(30) Foreign Application Priority Data

Jun. 22, 2016 (TW) .............................. 105119506 A (51) Int. Cl.
*H01L 23/48* (2006.01)
*H01L 27/11517* (2017.01)
*H01L 29/49* (2006.01)
*H01L 27/11563* (2017.01)
*H01L 29/786* (2006.01)
*H01L 29/66* (2006.01)

(52) U.S. Cl.
CPC .. *H01L 27/11517* (2013.01); *H01L 27/11563* (2013.01); *H01L 29/4916* (2013.01); *H01L 29/4958* (2013.01); *H01L 29/66969* (2013.01); *H01L 29/7869* (2013.01)

(58) Field of Classification Search
CPC ........... H01L 27/11517; H01L 29/4916; H01L 29/4958; H01L 27/11563; H01L 29/66969; H01L 29/7869; H01L 29/792; H01L 21/28282; H01L 29/408; H01L 29/4234; H01L 29/66833
See application file for complete search history.

(56) References Cited

U.S. PATENT DOCUMENTS

| | | | |
|---|---|---|---|
| 9,268,188 B2 | 2/2016 | Kimura | |
| 9,281,237 B2 | 3/2016 | Yamazaki | |
| 9,349,728 B1 | 5/2016 | Hsu | |
| 2011/0108835 A1* | 5/2011 | Kim | ................. H01L 29/78696 257/43 |
| 2011/0309876 A1* | 12/2011 | Terai | ................. H01L 29/7869 327/534 |

* cited by examiner

*Primary Examiner* — Cuong B Nguyen
(74) *Attorney, Agent, or Firm* — Winston Hsu (57) ABSTRACT

The present invention provides a semiconductor device and a method of forming the same, and the semiconductor device includes a first insulating layer, a source and a drain, a stacked structure, a second insulating layer, and a gate. The first insulating layer is disposed on a substrate. The source and the drain are disposed on the first insulating layer, and the stacked structure is also disposed on the first insulating layer, between the source and the drain. The stacked structure includes a charge storage layer and an oxide semiconductor (OS) layer disposed on the charge storage layer. The second insulating layer covers the source, the drain and the OS layer. The gate is disposed on the second insulating layer.

21 Claims, 6 Drawing Sheets

FIG. 11

SEMICONDUCTOR DEVICE AND METHOD OF FORMING THE SAME

BACKGROUND OF THE INVENTION

1. Field of the Invention

The present invention generally relates to a semiconductor device and a method of forming the same, and more particularly, to an oxide-semiconductor device available for data storage and a method of forming the same.

2. Description of the Prior Art

Semiconductor devices for data storage may be classified into volatile and non-volatile devices. When a power supply is interrupted, data stored in a volatile device will be lost. In comparison, data stored in a non-volatile device will remain even when the power supply is interrupted. This means non-volatile devices are more widely used in products; typically, in magnetic devices, optical discs, flash memory and other semiconductor memories. These memory devices use a silicon nitride layer as a charge trapping medium to constitute the floating gate. The tunneling effect and source side injection effect may trap the electrons in the floating gate to achieve the function of data storage.

In the technical field, how to extend the retention time of data stored in the floating gate of a non-volatile device is still a critical subject in current research and development.

SUMMARY OF THE INVENTION

One objective of the present invention is to provide a semiconductor device, in which, a charge storage layer is disposed under the channel layer and which does not overlap the source region and the drain region. The semiconductor device according to the present invention may be used for data storage and achieves better device reliability.

Another objective of the present invention is to provide a method of forming a semiconductor device, in which, a charge storage layer is formed under the channel layer without overlapping the source region and the drain region, wherein the obtained semiconductor device may be used for data storage.

In one embodiment of the present invention, a semiconductor device is provided including a first insulating layer, a source region, a drain region, a stacking structure, a dielectric layer and a gate. The first insulating layer is disposed on a substrate. The source region and the drain region are disposed on the first insulating layer. The stacking structure is disposed on the first insulating layer and between the source region and the drain region. The stacking structure includes a charge storage layer having an oxide semiconductor layer disposed thereon. The dielectric layer covers the source region, the drain region and the oxide semiconductor layer. The gate is disposed on the dielectric layer.

In another embodiment of the present invention, a method of forming a semiconductor device is provided including the following steps. A first insulating layer is provided. Subsequently, a stacking structure comprising a charge storage layer with an oxide semiconductor layer disposed thereon is formed on the first insulating layer. After that, a source region and a drain region are formed on the first insulating layer and at two sides of the stacking structure, respectively. Then, a dielectric layer covering the source region, the drain region and the stacking structure is formed. Afterward, a gate is formed on the dielectric layer.

One of the features of the present invention is that the charge storage layer is formed directly under the channel layer and does not overlap the source region and the drain region. The charge storage layer may include an oxide-nitride-oxide stacking structure or a floating gate. The semiconductor device according to the present invention may store induced charges in the charge storage layer, thereby achieving the function of data memory. By arranging the charge storage layer in that particular position, the semiconductor device according to the present invention may have a simplified structure, as well as a lower threshold voltage thereto obtain better device reliability.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 are schematic cross-sectional views showing steps of forming a semiconductor device according to a first embodiment of the present invention, wherein:

FIG. 6 to FIG. 8 are schematic cross-sectional views showing steps of forming a semiconductor device according to a second embodiment of the present invention, wherein:

FIG. 9 to FIG. 10 are schematic cross-sectional views showing steps of forming a semiconductor device according to a third embodiment of the present invention, wherein:

DETAILED DESCRIPTION

To provide a better understanding of the present invention to those of ordinary skill in the art, several exemplary embodiments will be detailed as follows, with reference to the accompanying drawings using numbered elements to elaborate the contents and effects to be achieved.

Figure 1:
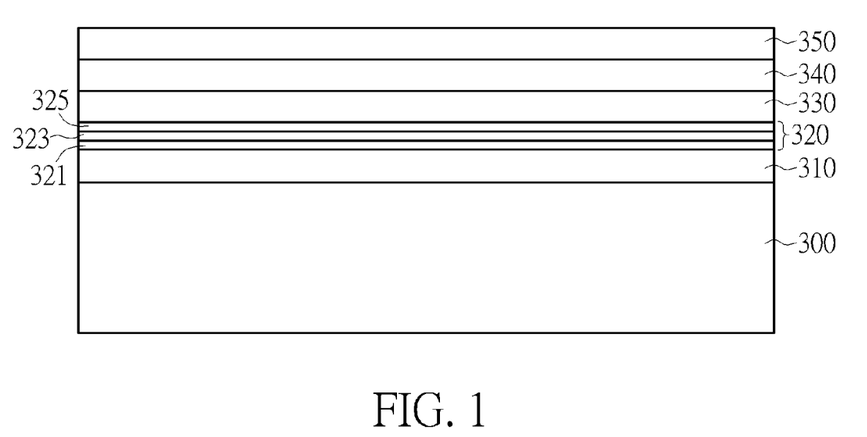
FIG. 1 illustrates a semiconductor device in the beginning of a series of successive steps.

Please refer to FIG. 1 to FIG. 5, which are schematic cross-sectional views showing steps of forming a semiconductor device according to a first embodiment of the present invention. A substrate 300 with an insulating layer 310 formed thereon is provided. The substrate 300 may be any suitable carrier on which other structures may be formed. For example, the substrate 300 may be a substrate made of semiconductor material, such as a silicon substrate, an epitaxial silicon substrate or a silicon on insulator (SOI) substrate, but is not limited hereto. The insulating layer 310 may have a single layer structure as shown in FIG. 1, or have a multilayer structure (not shown). According to one embodiment, the insulating layer 310 may include a metal interconnection system (not shown) or passive devices (not shown), such as inductors, capacitors or resistors, formed therein. Furthermore, the substrate 300 may include other devices (not shown), such as metal oxide semiconductor (MOS) or photo-diode devices, formed thereon or therein, but is not limited hereto.

Subsequently, a charge storage material layer 320, an insulating material layer 330, an oxide semiconductor (OS) material layer 340 and a cap material layer 350 are successively formed on the substrate 300 by, for instance, a chemical vapor deposition (CVD) process, to form a stacking material structure. According to the embodiment, the charge storage material layer 320 may have a multilayer structure and be formed directly on the insulating layer 310. For example, the charge storage material layer 320 may include a first dielectric material layer 321, a charge trapping material layer 323 and a second dielectric material layer 325. The first dielectric material layer 321 and the second dielectric material layer 325 may include silicon oxide ($SiO_2$), and the charge trapping material layer 323 may include silicon nitride (SiN), thereby an oxide-nitride-oxide structure is formed, as shown in FIG. 1. According to another embodiment of the present invention, the charge trapping material layer 323 may include tantalum oxide (TaO), strontium titanate ($SrTiO_3$) or hafnium oxide ($HfO_2$).

The oxide semiconductor material layer 340 may include indium gallium zinc oxide (InGaZnO), $InGaO_2$, $InZnO_2$, ZnInO or GaZnO, which serves as a channel layer. In a preferred embodiment, a material having high carrier mobility and low leakage characteristics such as C-axis aligned crystal InGaZn (CAAC-InGaZnO) is selected to form the oxide semiconductor material layer 340. Those skilled in the art should be able to understand that the oxide semiconductor material layer 340 is not limited thereto, and in another embodiment, the oxide semiconductor material layer 340 may include multilayers with each layer including the same or different materials. On the other hand, the insulating material layer 330 is formed between the charge storage material layer 320 and the oxide semiconductor material layer 340. The insulating layer 330 may include general low-k dielectric materials, high-k dielectric materials, or oxide semiconductor materials other than the oxide semiconductor material layer 340, such as materials selected from indium gallium zinc oxide (InGaZnO), $InGaO_2$, $InZnO_2$, ZnInO and GaZnO.

Then, the cap material layer 350 is formed on the oxide semiconductor material layer 340. The cap material layer 350 may include silicon notride (SiN), silicon carbie (SiC), silicon oxynitride (SiON) or silicon carbonitride (SiCN). The cap material layer 350 may protect the underneath oxide semiconductor material layer 340 from being damaged during the following process.

Figure 2:
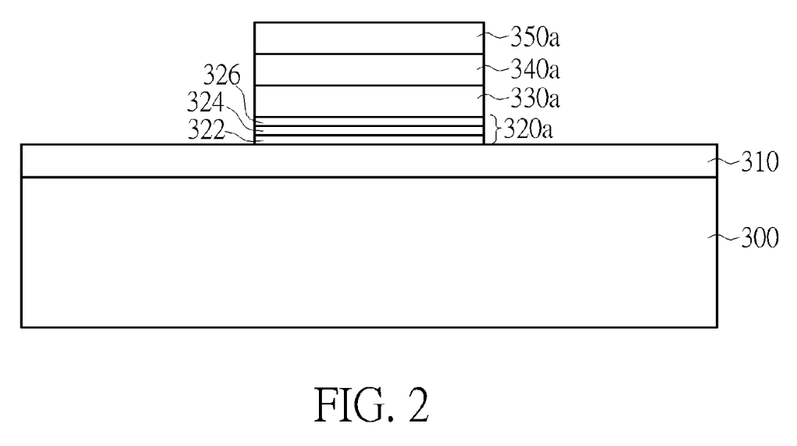
FIG. 2 illustrates a semiconductor device after forming a stacking structure.

Next, as shown in FIG. 2, the stacking material structure is patterned to obtain a stacking structure and expose a portion of the underneath insulating layer 310. The stacking structure includes (from bottom to top) a charge storage layer 320*a*, an insulating layer 330*a*, an oxide semiconductor layer 340*a* and a cap layer 350*a*. The charge storage layer 320*a* may include a first dielectric layer 322, a charge trapping layer 324 and a second dielectric layer 326, thereby forming an oxide-nitride-oxide structure as shown in FIG. 2.

Figure 3:
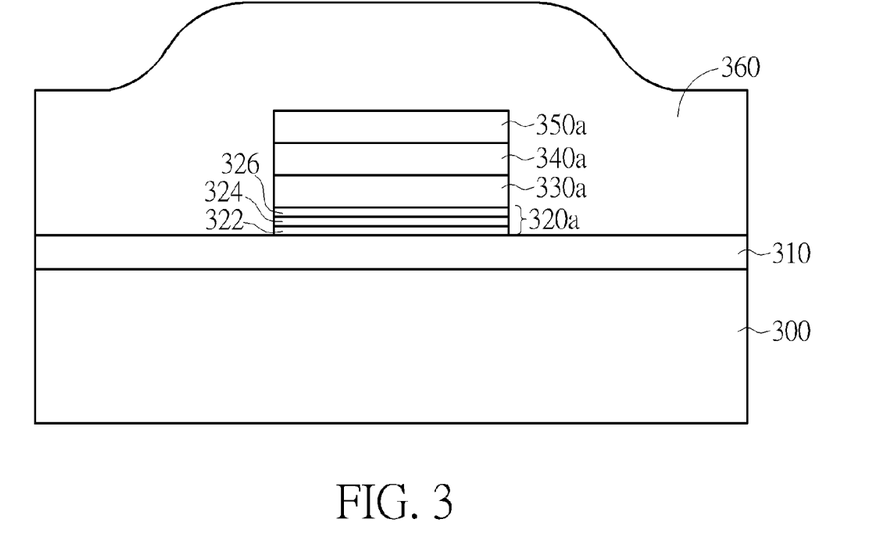
FIG. 3 illustrates a semiconductor device after forming a conductive material layer.

Following, as shown in FIG. 3, a conductive material layer 360 is formed on the substrate 300 and completely covers the stacking structure. The conductive material 360 may include conductive materials such as copper, aluminum, molybdenum, titanium and tantalum, but is not limited hereto.

Figure 4:
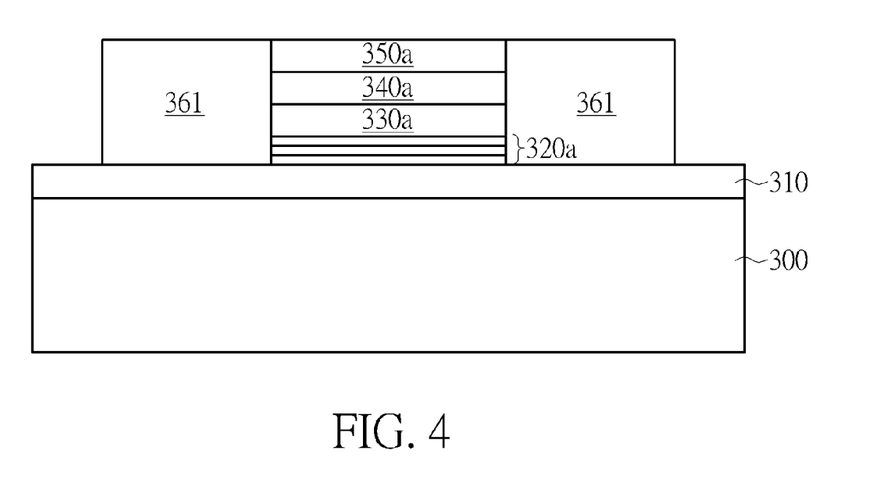
FIG. 4 illustrates a semiconductor device after forming a source region and a drain region.

The conductive material layer 360 is then patterned to form a source region 361 and a drain region 361 disposed at two sides of the stacking structure, respectively. According to the embodiment, at least an etching process and/or a planarization process is involved to form the source 361 region and the drain region 361. For example, a chemical mechanical polishing (CMP) process and a dry etching process may be performed successively to form the source region 361 and the drain region 361, wherein top surfaces of the source region 361 and the drain region 361 are flush with the stacking structure, as shown in FIG. 4. In another embodiment, other processes may be involved in forming the source region 361 and the drain region 361, such as a photo-etching-process. It should be noted that, during the etching process and/or planarization process or other applicable processes, the cap layer 350*a* atop the stacking structure may serve as an etching stop layer, which protects the underneath oxide semiconductor layer 340*a* from being damaged. Moreover, according to the present invention, the source region 361, the drain region 361 and the stacking structure are all disposed on the insulating layer 310 with their bottom surfaces flush to each other. That is, the source region 361, the drain region 361 and the stacking structure do not overlap each other as shown in FIG. 4.

Figure 5:
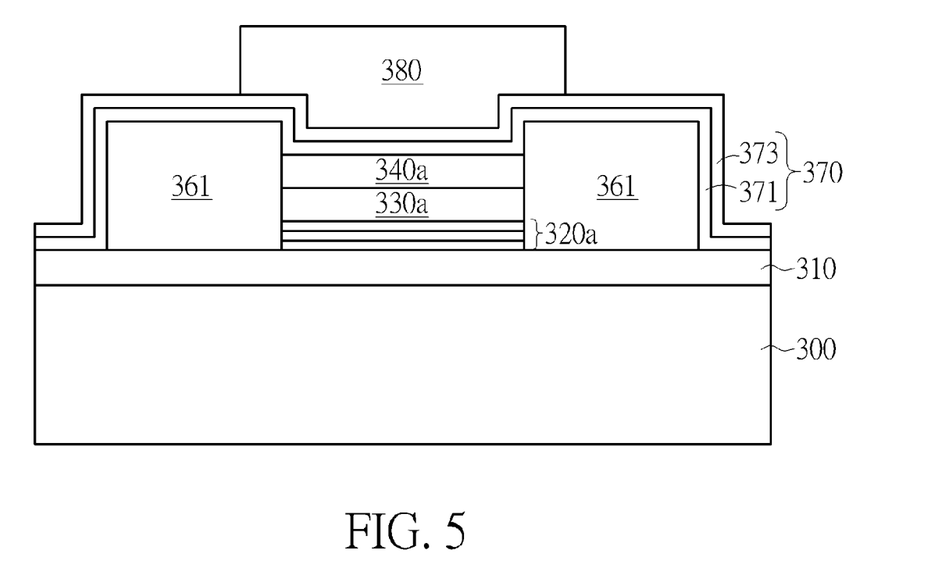
FIG. 5 illustrates a semiconductor device after forming a gate.

After forming the source region 361 and the drain region 361, the cap layer 350*a* is removed to expose the oxide semiconductor layer 340*a*, so that a surface of the exposed oxide semiconductor layer 340*a* is lower than the source region 361 and the drain region 361. Subsequently, a gate dielectric layer 370 and a gate 380 are formed on the source region 361, the drain region 361 and the oxide semiconductor layer 340*a*. As shown in FIG. 5, the gate dielectric layer 370 is formed between the gate 380 and the oxide semiconductor layer 340*a*, covers the source region 361, the drain region 361, the oxide semiconductor layer 340*a*, and even covers the upper surface of the insulating layer 310. According to an embodiment, the gate dielectric layer 370 may include a single-layer structure or a multilayer structure. For example, as shown in FIG. 5, the gate dielectric layer 370 may include agate dielectric layer 371 covering and in direct contact with the source region 361, the drain region 361 and the oxide semiconductor layer 340*a*, and another gate dielectric layer 373 covering the gate dielectric layer 371. The gate dielectric layer 371 and gate dielectric layer 373 may have the same or different materials, such as low-k dielectric materials comprising silicon oxide, or high-k dielectric material comprising hafnium oxide ($HfO_2$) and aluminum oxide ($Al_2O_3$). Additionally, the gate dielectric layer 373 may further include InGaZnO, ZnInO or GaZnO, but is not limited hereto.

The gate 380 may include conductive materials, such as copper, aluminum, molybdenum, titanium and tantalum. Specifically, the gate 380 is formed to align with the underneath oxide semiconductor layer 340*a*. Preferably, the gate 380 overlays at least a portion of the underneath oxide semiconductor layer 340*a*. For example, as shown in FIG. 5, the gate 380 is formed on the center of the oxide semiconductor layer 340*a* in a projection direction perpendicular to the substrate 300, and completely covering the oxide semiconductor layer 340*a*.

Accordingly, a semiconductor device according to the first embodiment of the present invention is formed. As shown in FIG. 5, the obtained semiconductor device includes a charge storage layer 320*a* directly under the oxide semiconductor layer 340a (channel layer) and does not overlay the source region 361 and the drain region 361. By applying different voltages on the source region 361 and the drain region 361, the induced charges may be stored in the charge storage layer 320a and therefore the data storage function of the semiconductor device is achieved. The configuration of the semiconductor device including the charge storage layer 320a disposed in the particular position avoids the need to form an additional bottom gate under the oxide semiconductor layer 340a to control the storage of the induced charges. Therefore, the semiconductor device according to the present invention has a simplified structure and a lower threshold voltage.

Those skilled in the art should easily understand that the semiconductor device of the present invention may be formed by other methods rather than limited to the aforesaid manufacturing steps. Other embodiments or variations directed to the semiconductor devices and the manufacturing methods will be described in the following paragraphs. To simplify the disclosure, the following description will focus on and be directed to the different features between the embodiments rather than redundantly repeating similar components. In addition, like reference numerals will refer to like elements throughout the disclosure to facilitate comparison between the embodiments.

Figure 6:
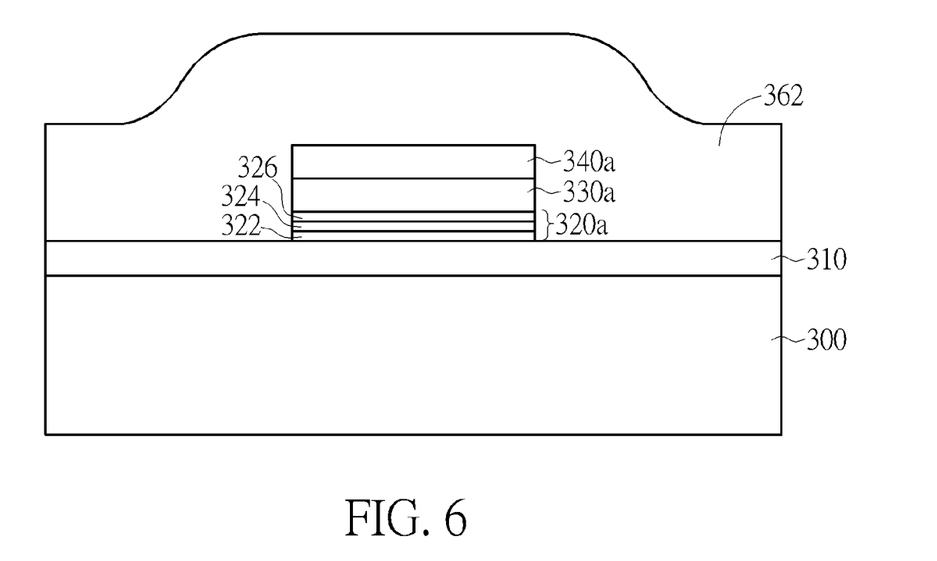
FIG. 6 illustrates a semiconductor device after forming a conductive material layer.
Figure 7:
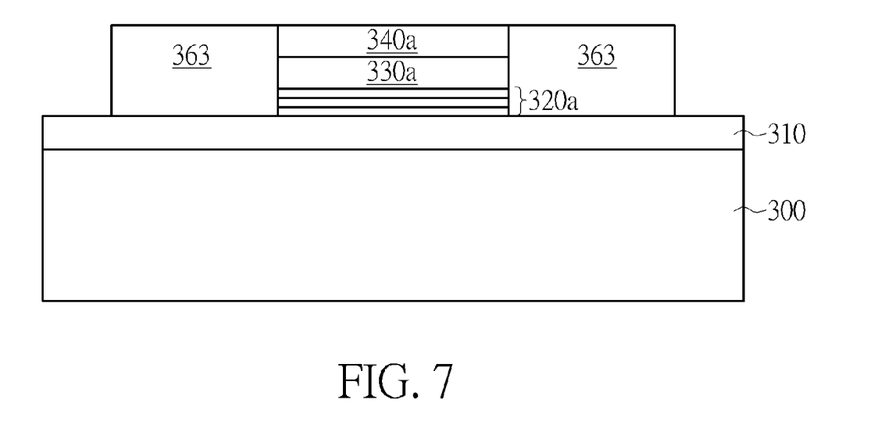
FIG. 7 illustrates a semiconductor device after forming a source region and a drain region.
Figure 8:
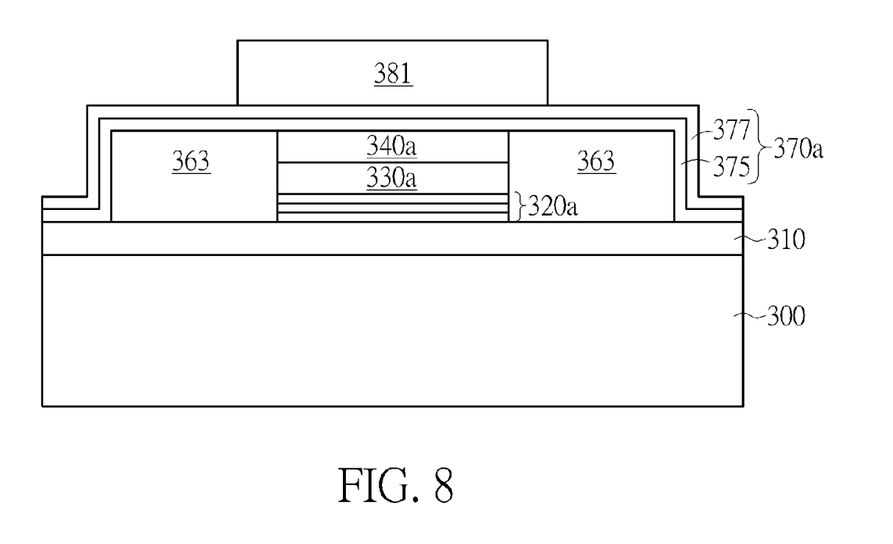
FIG. 8 illustrates a semiconductor device after forming a gate.

Please refer to FIG. 6 to FIG. 8, which are schematic cross-sectional views showing steps of forming a semiconductor device according to a second embodiment of the present invention. The process, chosen materials and features in the second embodiment (including forming a stacking structure) are similar to those in the first embodiment shown in FIG. 1 to FIG. 3, and will not be narrated herein. The difference is that, in the second embodiment, the stacking structure only includes a charge storage layer 320a, an insulating layer 330a and an oxide semiconductor layer 340a. In other words, the cap layer on the oxide semiconductor layer 340a is omitted in the second embodiment.

As shown in FIG. 6, after forming the stacking structure, a conductive material layer 362 is formed directly on the oxide semiconductor layer 340a and completely covers the stacking structure. The conductive material layer 362 may include conductive materials such as copper, aluminum, molybdenum, titanium and tantalum, or metal oxides of the conductive materials, but is not limited hereto.

Subsequently, the conductive material layer 362 is patterned to form a source region 363 and a drain region 363 which are disposed at two sides of the stacking structure, respectively. Similarly, at least an etching process and/or a planarization process are/is involved to form the source 363 region and the drain region 363. For example, a chemical mechanical polishing (CMP) process and a dry etching process may be performed successively to form the source region 361 and the drain region 361, wherein top surfaces of the source region 363 and the drain region 363 are flush with the stacking structure, as shown in FIG. 7. Because the cap layer is omitted in the present invention, the upper surface of the oxide semiconductor layer 340a is flush with the source region 363 and the drain region 363, as shown in FIG. 7.

Afterward, a gate dielectric layer 370a and a gate 381 are formed on the source region 363, the drain region 363 and the oxide semiconductor layer 340a. As shown in FIG. 8, the gate dielectric layer 370a is formed between the gate 381 and the oxide semiconductor layer 340a, covers the source region 363, the drain region 363, the oxide semiconductor layer 340a, and even covers the upper surface of the insulating layer 310. According to an embodiment, the gate dielectric layer 370a may include a single-layer structure or a multilayer structure. For example, as shown in FIG. 8, the gate dielectric layer 370a may include a gate dielectric layer 375 covering and in direct contact with the source region 363, the drain region 363 and the oxide semiconductor layer 340a, and another gate dielectric layer 377 covering the gate dielectric layer 375. The gate dielectric layer 375 and gate dielectric layer 377 may have the same material or different materials, such as low-k dielectric materials comprising silicon oxide, or high-k dielectric materials comprising hafnium oxide ($HfO_2$) or aluminum oxide ($Al_2O_3$). Additionally, the gate dielectric layer 377 may further include InGaZnO, ZnInO or GaZnO, but is not limited hereto.

The gate 381 may include conductive materials, such as copper, aluminum, molybdenum, titanium and tantalum. Particularly, the gate 380 is formed to align with the underneath oxide semiconductor layer 340a. Specifically, the gate 381 overlays at least a portion of the underneath oxide semiconductor layer 340a. For example, as shown in FIG. 8, the gate 381 may be formed on the central portion of the oxide semiconductor layer 340a in a projection direction perpendicular to the substrate 300 and, and completely covering the oxide semiconductor layer 340a.

Accordingly, a semiconductor device according to the second embodiment of the present invention is formed. The semiconductor device according to the second embodiment includes a charge storage layer 320a directly under the oxide semiconductor layer 340a (namely, the channel layer) and not overlaying the source region 363 and the drain region 363. The semiconductor device according to the second embodiment has a more simplified structure as the cap layer has been omitted and the upper surface of the oxide semiconductor layer 340a is flush with the source region 363 and the drain region 363. By applying different voltages on the source region 363 and the drain region 363, the induced charges may be stored in the charge storage layer 340a and therefore the data storage function of the semiconductor device is achieved.

Figure 9:
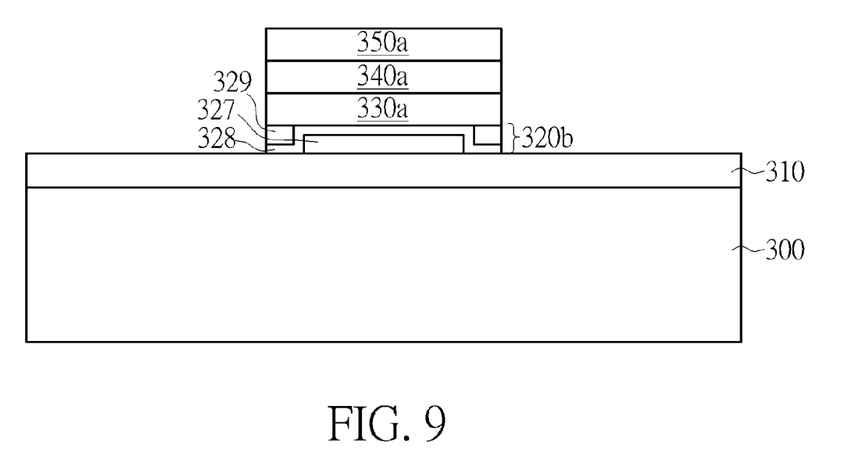
FIG. 9 illustrates a semiconductor device after forming a stacking structure.
Figure 10:
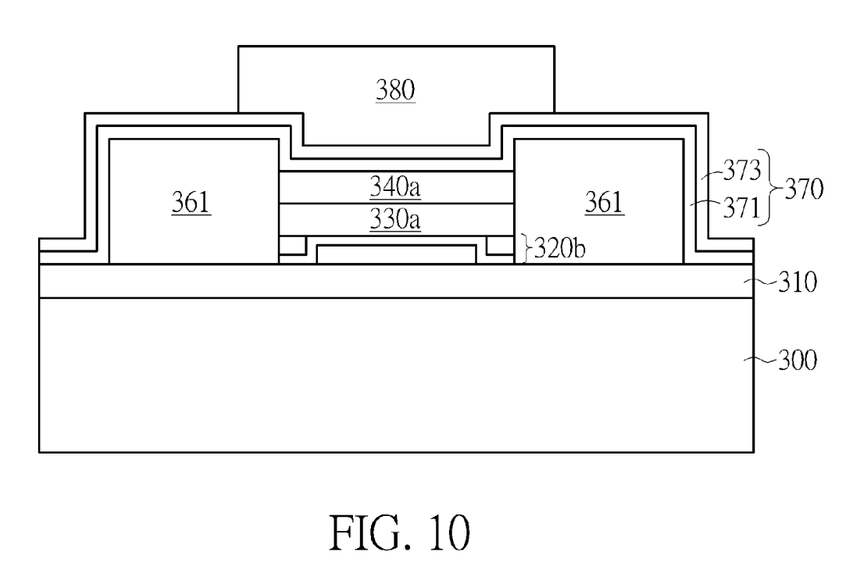
FIG. 10 illustrates a semiconductor device after forming a gate.

Please refer to FIG. 9 to FIG. 10, which are schematic cross-sectional views showing steps of forming a semiconductor device according to a third embodiment of the present invention. The process, chosen materials and features in the third embodiment are similar to the first embodiment and will not be repeated herein. The difference is that, in the third embodiment, the charge storage layer 320a includes a floating gate 327.

According to the third embodiment, the stacking structure includes a charge storage layer 320b, an insulating layer 330a, an oxide semiconductor layer 340a and a cap layer 350a stacked on over another on the substrate 300, wherein the charge storage layer 320b includes a floating gate 327 which is directly formed on the insulating layer 310. Specifically, the floating gate 327 is formed in an insulating layer 329, and completely covered by a protecting layer 328, such as a dielectric layer made of silicon oxide or silicon nitride, to prevent loss of storage charges. The floating gate 327 may be formed by forming a material layer such as doped polysilicon (not shown) on the insulating layer 310 in a blanket manner, and then patterning the material layer to obtain the floating gate 327. After that, a protecting material layer (not shown) and an insulating material layer (not shown) are formed successively on the floating gate 327 by a deposition and planarization process, so that a top surface of the insulating material layer is flush with the protecting material layer. Afterward, the insulating material layer, the protecting material layer and the subsequent formed stacking material structure for example including the insulating material layer 330, the oxide semiconductor layer 340 and the cap material layer 350 as shown in FIG. 1 are patterned together by the same photolithography and etching process, and thereby the protecting layer 328 and the insulating layer 329 is obtained, as shown in FIG. 9.

Subsequently, steps similar to those steps in the first embodiment shown in FIG. 3 to FIG. 4 may be performed. The source region 361 and the drain region 361 are formed and the cap layer 350a is removed to expose the underneath oxide semiconductor layer 340a wherein the exposed oxide semiconductor layer 340a has a surface lower than the source region 361 and the drain region 361. Further processes comprising forming the gate dielectric layer 370 and the gate 380 may be carried onto obtain the semiconductor device as shown in FIG. 10. The semiconductor device according to the third embodiment as shown in FIG. 10 includes a floating gate 327 directly under the oxide semiconductor layer 340a (channel layer) and does not overlap the source region 361 and the drain region 361. The data storage function of the semiconductor device may be achieved by applying different voltages on the source region 361 and the drain region 361, therefore the induced charges may be stored in the floating gate 327. Meanwhile, the floating gate 327 of the semiconductor device according to the third embodiment avoids the need to form an additional bottom gate under the oxide semiconductor layer 340a for controlling storage of the induced charges. The semiconductor device according to the third embodiment may have a simplified structure and a lower threshold voltage accordingly.

Figure 11:
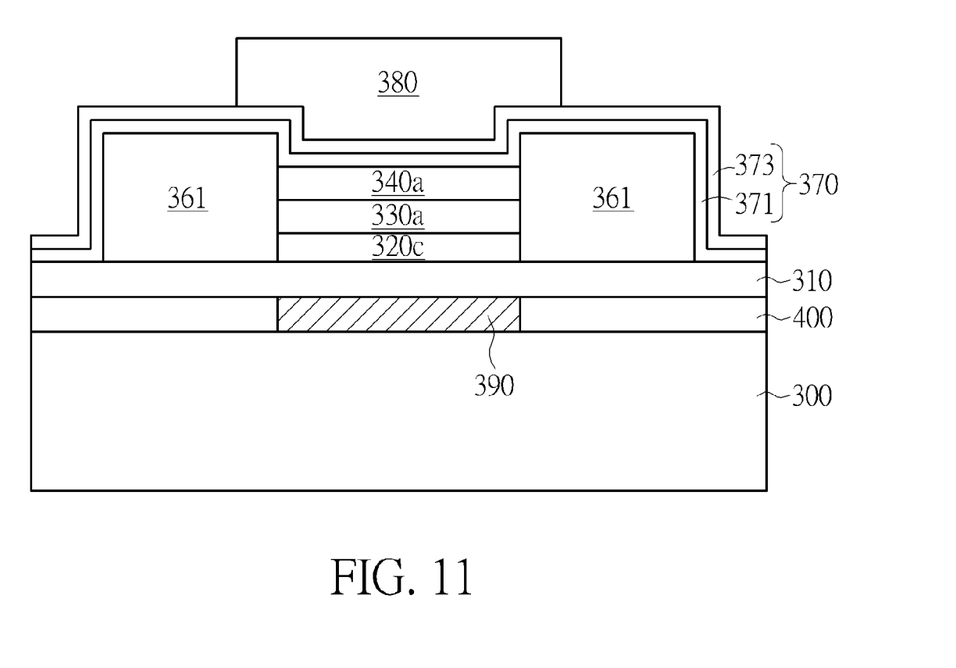
FIG. 11 is a schematic cross-sectional view showing a semiconductor device according to a fourth embodiment of the present invention.

Please refer to FIG. 11, which is a schematic cross-sectional view showing a semiconductor device according to a fourth embodiment of the present invention. The process, chosen materials and features in the embodiment, including forming a stacking structure, are similar to those in the first embodiment, and will not be repeated herein. The differences are that, in the fourth embodiment, an additional gate 390 is formed between the substrate 300 and the insulating layer 310, and the charge storage layer 320c only includes an oxide semiconductor layer.

In the fourth embodiment, as shown in FIG. 11, the gate 390 and an insulating layer 400 which is flush with a top surface of the gate 390 are formed on the substrate 300. Afterward, the insulating layer 310 and the stacking structure disposed thereon are formed. According to the fourth embodiment, the stacking structure includes a charge storage layer 320c, an insulating layer 330a, an oxide semiconductor layer 340a and a cap layer (not shown in drawings of the present embodiment) stacked one over another on the insulating layer 310. The charge storage layer 320c is an oxide semiconductor layer, and may include a single layer structure as shown in FIG. 11, or a multilayer structure. The material of the charge storage layer 320c may be the same or different from the oxide semiconductor layer 340a, and may be selected from indium gallium zinc oxide (InGaZnO), $InGaO_2$, $InZnO_2$, ZnInO, GaZnO or the combination thereof.

Subsequently, steps similar to those in the first embodiment shown in FIG. 3 to FIG. 5 may be performed. The source region 361 and the drain region 361 are formed and the cap layer is removed to expose the underneath oxide semiconductor layer 340a wherein the exposed oxide semiconductor layer 340a has a surface lower than the source region 361 and the drain region 361. Further processes comprising forming the gate dielectric layer 370 and the gate 380 may be performed to obtain the semiconductor device, as shown in FIG. 11. The semiconductor device according to the fourth embodiment as shown in FIG. 11 includes a gate 390 directly under the oxide semiconductor layer 340a (channel layer). Data, such as binary digital data, may be memorized in the semiconductor device by directly using the gate 390 to control the source region 361 and the drain region 361 to store the induced charges in the charge storage layer 320c. In other words, the gate 390 may be used directly to be a controlling gate for data access. Additionally, the charge storage layer 320c may include a single layer or multilayer of oxide semiconductor material, so the process of forming the semiconductor device and the structure of the obtained semiconductor device may be more simplified. It should be noted that the gate 390 formed between the substrate 300 and the insulating layer 310 as shown in the fourth embodiment may also be applicable to the second embodiment and the third embodiment. Meanwhile, the charge storage layer in the second embodiment or the third embodiment may also include a single layer or multilayer of oxide semiconductor material.

The semiconductor device according to the present invention includes a charge storage layer (such as an oxide-nitride-oxide layer or a floating gate) directly under the channel layer which does not overlap the source region and the drain region. The data may be stored in the semiconductor device by applying different voltages on the source region and the drain region; therefore, the induced charges may be stored in the charge storage layer. Meanwhile, the configuration of the semiconductor device comprising a charge storage layer disposed in the particular position as illustrated in the present invention may avoid the need of forming an additional bottom gate under the channel layer to control the storage of the induced charge. A semiconductor device having a simplified structure, lower threshold voltage and better reliability may be obtained.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a first insulating layer disposed on a substrate;
a source region and a drain region disposed on the first insulating layer;
a stacking structure disposed on the first insulating layer between the source region and the drain region, wherein the stacking structure comprises a charge storage layer and an oxide semiconductor layer disposed thereon, the charge storage layer comprises an oxide-nitride-oxide stacking structure and sidewalls of the charge storage layer and the oxide semiconductor layer are vertically aligned;
a dielectric layer covering the source region, the drain region and the oxide semiconductor layer; and
a gate disposed on the dielectric layer.

2. The semiconductor device according to claim 1, wherein the charge storage layer comprises a floating gate.

3. The semiconductor device according to claim 2, further comprising a second insulating layer covering the floating gate.

4. The semiconductor device according to claim 1, wherein the stacking structure further comprises a third insulating layer disposed between the oxide semiconductor layer and the charge storage layer.

5. The semiconductor device according to claim 1, wherein the stacking structure and the source region and the drain region do not overlap with each other.

6. The semiconductor device according to claim 1, wherein a top surface of the oxide semiconductor layer is flush with the source region and the drain region.

7. The semiconductor device according to claim 1, wherein a top surface of the oxide semiconductor layer is lower than the source region and the drain region.

8. The semiconductor device according to claim 1, wherein a bottom surface of the stacking structure is flush with the source region and the drain region.

9. The semiconductor device according to claim 1, wherein the charge storage layer is in contact with the first insulating layer.

10. The semiconductor device according to claim 1, wherein the source region, the drain region and the stacking structure are disposed on a flat top surface of the first insulating layer.

11. The semiconductor device according to claim 1, wherein the dielectric layer is in direct contact with the oxide semiconductor layer.

12. A method of forming a semiconductor device, comprising:
   providing a first insulating layer;
   forming a stacking structure on the first insulating layer, wherein the stacking structure comprises a charge storage layer and an oxide semiconductor layer disposed thereon, wherein the charge storage layer comprises an oxide-nitride-oxide stacking structure and sidewalls of the charge storage layer and the oxide semiconductor layer are vertically aligned;
   forming a source region and a drain region on the first insulating and disposed on each side of the stacking structure respectively;
   forming a dielectric layer covering the source region, the drain region and the stacking structure; and
   forming a gate disposed on the dielectric layer.

13. The method of forming a semiconductor device according to claim 12, wherein the stacking structure further comprises:
   a third insulating layer formed between the charge storage layer and the oxide semiconductor layer; and
   a cap layer formed on the oxide semiconductor layer.

14. The method of forming a semiconductor device according to claim 13, wherein the forming of the stacking structure comprises:
   forming a charge storage material layer, an insulating material layer, an oxide semiconductor material layer and a cap material layer stacked successively on the first insulating layer; and
   patterning the charge storage material layer, the insulating material layer, the oxide semiconductor material layer and the cap material layer to form the stacking structure.

15. The method of forming a semiconductor device according to claim 13, wherein the forming of the source region and the drain region comprises:
   forming a conductive material layer on the first insulating layer and covering the stacking structure; and
   patterning the conductive material layer to form the source region and the drain region.

16. The method of forming a semiconductor device according to claim 15, further comprising:
   removing the cap layer after forming the source region and the drain region.

17. The method of forming a semiconductor device according to claim 12, wherein a bottom surface of the stacking structure is flush with the source region and the drain region.

18. The method of forming a semiconductor device according to claim 15, wherein a top surface of the stacking structure is flush with the source region and the drain region.

19. The method of forming a semiconductor device according to claim 12, wherein the charge storage layer is in contact with the first insulating layer.

20. The method of forming a semiconductor device according to claim 12, wherein the charge storage layer comprises an oxide-nitride-oxide stacking structure.

21. The method of forming a semiconductor device according to claim 12, wherein the charge storage layer comprises a floating gate.

* * * * *